United States Patent
Hansen et al.

(10) Patent No.: US 11,075,102 B2
(45) Date of Patent: Jul. 27, 2021

(54) POSITIONING DEVICE

(71) Applicant: SUSS MicroTec Lithography GmbH, Garching (DE)

(72) Inventors: Sven Hansen, Garching (DE); Georg Fink, Garching (DE); Henrik Petry, Garching (DE)

(73) Assignee: SUSS MICROTEC LITHOGRAPHY GMBH, Garching (DE)

( * ) Notice: Subject to any disclaimer, the term of this patent is extended or adjusted under 35 U.S.C. 154(b) by 33 days.

(21) Appl. No.: 15/806,950

(22) Filed: Nov. 8, 2017

(65) Prior Publication Data
US 2018/0138070 A1 May 17, 2018

(30) Foreign Application Priority Data

Nov. 11, 2016 (NL) .................... 2017773

(51) Int. Cl.
*H01L 21/68* (2006.01)
*H01L 21/687* (2006.01)
(Continued)

(52) U.S. Cl.
CPC ........ *H01L 21/68* (2013.01); *H01L 21/67017* (2013.01); *H01L 21/67092* (2013.01);
(Continued)

(58) Field of Classification Search
CPC ..................................................... H01L 21/68
See application file for complete search history.

(56) References Cited

U.S. PATENT DOCUMENTS 3,674,368 A * 7/1972 Johannsmeier ..... G03F 7/70691
355/78
3,858,978 A * 1/1975 Johannsmeier ..... G03F 7/70691
355/79
(Continued)

FOREIGN PATENT DOCUMENTS

CN 103376586 A 10/2013
JP 4633531 11/1971
(Continued)

OTHER PUBLICATIONS

Machine Translation JP2012186243A (Year: 2012).*
(Continued)

*Primary Examiner* — Matthew J Daniels
*Assistant Examiner* — Wayne K. Swier
(74) *Attorney, Agent, or Firm* — Hayes Soloway PC

(57) ABSTRACT

The invention relates to a positioning device for positioning a substrate, in particular a wafer, comprising: a process chamber; a base body; a carrier element which comprises a support for supporting the substrate, the carrier element being arranged above the base body and formed movable in terms of distance from the base body; and a holder for an additional substrate, in particular an additional wafer or a mask, the holder being arranged opposite the carrier element; wherein there is, between the base body and the carrier element, a sealed-off cavity to which a pressure, in particular a negative pressure, can be applied so as to prevent undesired movement of the carrier element as a result of the action of an external force.

11 Claims, 7 Drawing Sheets

(51) Int. Cl.
    *H01L 21/683*     (2006.01)
    *H01L 21/67*       (2006.01)
    *H01L 23/00*       (2006.01)

(52) U.S. Cl.
    CPC ...... *H01L 21/67126* (2013.01); *H01L 21/682* (2013.01); *H01L 21/6838* (2013.01); *H01L 21/68735* (2013.01); *H01L 21/68742* (2013.01); *H01L 24/75* (2013.01); *H01L 24/83* (2013.01); *H01L 2224/75101* (2013.01); *H01L 2224/75704* (2013.01); *H01L 2224/75724* (2013.01); *H01L 2224/75755* (2013.01); *H01L 2224/75981* (2013.01); *H01L 2224/838* (2013.01); *H01L 2224/83091* (2013.01); *H01L 2224/83136* (2013.01)

(56) References Cited

U.S. PATENT DOCUMENTS

| | | | |
|---|---|---|---|
| 4,226,569 A | | 10/1980 | Gerard et al. |
| 5,010,295 A | * | 4/1991 | Lindsay ............ G01R 1/06705 269/21 |
| 5,858,587 A | * | 1/1999 | Yamane ................ F16C 29/025 430/22 |
| 6,063,196 A | * | 5/2000 | Li ....................... C23C 16/4583 118/712 |
| 2004/0036850 A1 | * | 2/2004 | Tsukamoto ............. G03F 7/707 355/72 |
| 2006/0060259 A1 | * | 3/2006 | Devitt ............... H01L 21/68714 141/65 |
| 2010/0139836 A1 | * | 6/2010 | Horikoshi ............... H01L 21/68 156/64 |
| 2011/0214809 A1 | * | 9/2011 | Sugiyama ......... H01L 21/67092 156/285 |
| 2014/0007669 A1 | * | 1/2014 | Akada .................. G01P 13/0006 73/170.01 |
| 2014/0072774 A1 | * | 3/2014 | Kito ................... H01L 21/67092 428/174 |
| 2015/0050118 A1 | * | 2/2015 | Sorabji ............. H01L 21/67259 414/806 |
| 2015/0206783 A1 | * | 7/2015 | Johnson .............. H01L 21/6719 279/4.12 |

FOREIGN PATENT DOCUMENTS

| | | | | |
|---|---|---|---|---|
| JP | 2002313688 A | * | 10/2002 | |
| JP | 2002313688 A | | 10/2002 | |
| JP | 2003249425 A | * | 9/2003 | |
| JP | 2003249425 A | | 9/2003 | |
| JP | 4633531 B2 | * | 2/2011 | |
| JP | 2011023886 A | | 2/2011 | |
| JP | 2012054416 A | * | 3/2012 | |
| JP | 2012054416 A | | 3/2012 | |
| JP | 2012186243 A | * | 9/2012 | ........... B23K 20/023 |
| JP | 2012186243 A | | 9/2012 | |
| WO | 2011098604 A2 | | 8/2011 | |
| WO | 2012121044 A1 | | 9/2012 | |

OTHER PUBLICATIONS

Machine Translation JP2002313688 (Year: 2002).*
Machine Translation JP2003249425 (Year: 2003).*
Machine Translation JP4633531 (Year: 2011).*
JP2012054416 (Year: 2012).*

* cited by examiner

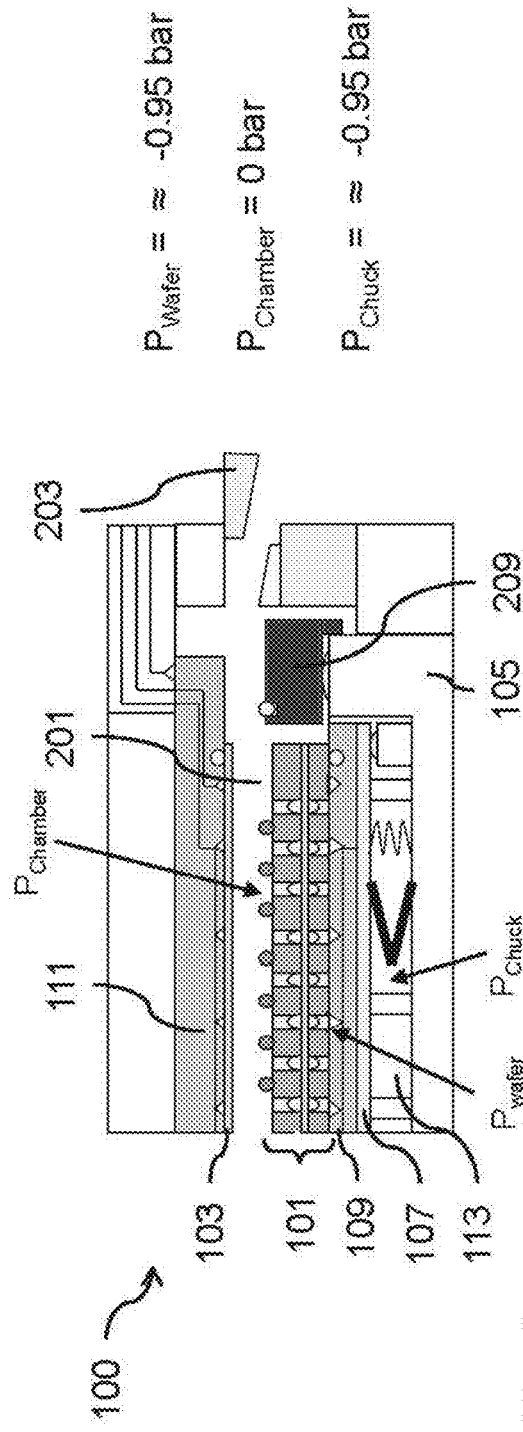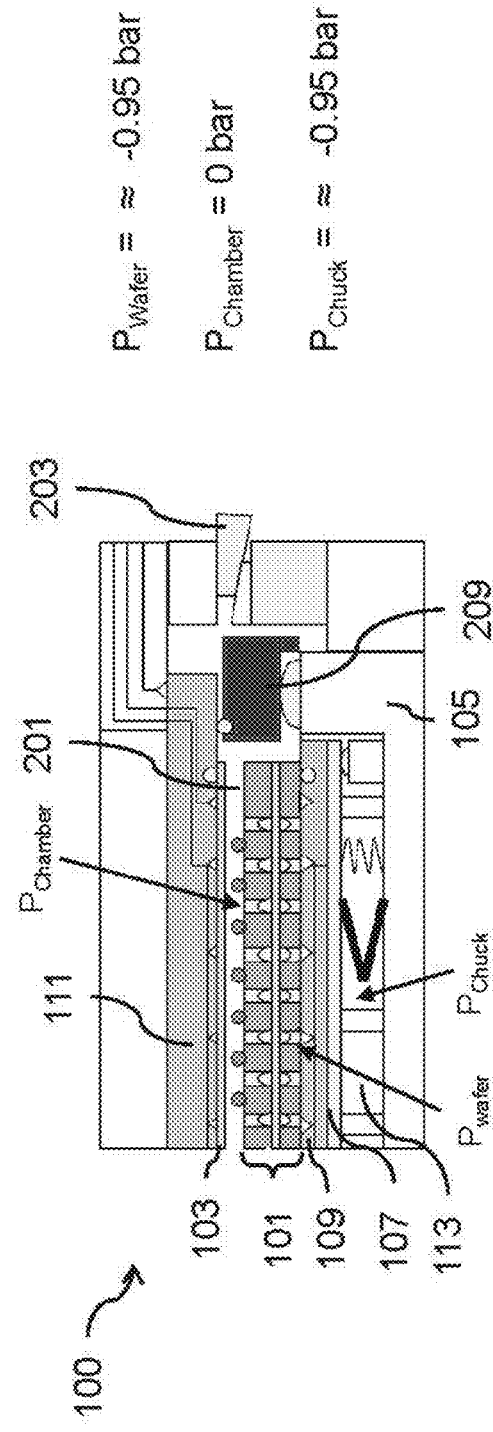

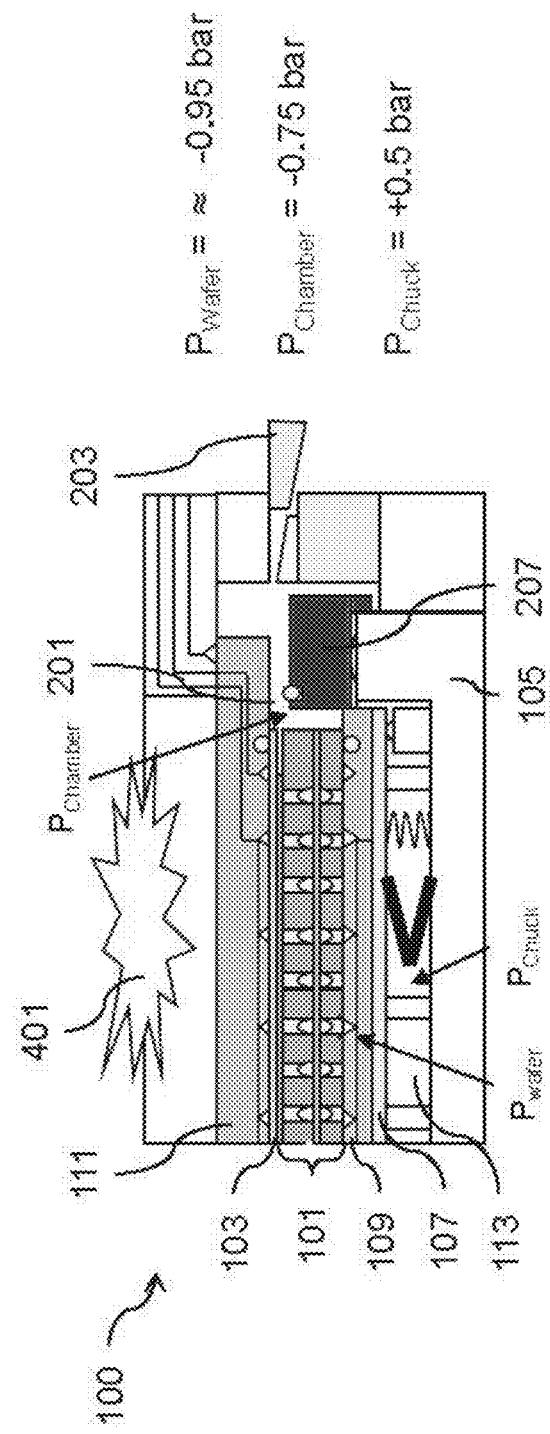

POSITIONING DEVICE

CROSS-REFERENCE TO RELATED APPLICATIONS AND PRIORITY

This patent application claims priority from Dutch Patent Application No. 2017773 filed on Nov. 11, 2016, the entirety of which is hereby incorporated by reference.

The present invention relates to a positioning device for substrates and to a method for bringing together substrates.

BACKGROUND OF THE INVENTION

Mask aligners are used for exactly positioning masks for photolithography. The mask is generally arranged above a substrate comprising a photoresist layer, for example a glass or semiconductor wafer. Subsequently, the substrate is illuminated through the mask.

The wafer generally rests on a special wafer holder, known as a chuck, below the mask. Often, the distance between the wafer and the mask is adjustable, for example so as to bring the mask into contact with the water for the illumination.

In some mask aligners, the chuck and the mask are located in an evacuable vacuum chamber. This makes it possible to establish vacuum contact between the mask and the wafer by evacuating the vacuum chamber and subsequently bringing together the mask and the wafer.

During the evacuation of the vacuum chamber, however, the chuck may be pressed against the mask prematurely because of the resulting atmospheric pressure. Cavities or structures on the surface of the wafer can thus be sealed off prematurely and not fully evacuated, and this can have a negative effect on the lithography result.

A similar problem can occur when two wafers are bonded in a wafer bonder. When a bond processing chamber is evacuated in a vacuum bonding process, two wafers arranged opposite can be pressed onto one another prematurely as a result of the resulting atmospheric pressure. Thus, cavities on a wafer surface may not be fully evacuated, making it possible for inclusions of air to occur between the wafers.

The object of the present invention is therefore to position a substrate, in particular a wafer, efficiently in the presence of external forces.

This object is achieved by the features of the independent claims. Advantageous developments form the subject matter of the dependent claims, the description and the drawings.

BRIEF DESCRIPTION OF THE INVENTION

In a first aspect, the invention relates to a positioning device for positioning a substrate, in particular a wafer, comprising a process chamber, a base body; a carrier element which comprises a support for supporting the substrate, the carrier element being arranged above the base body and formed movable in terms of distance from the base body, and a holder for an additional substrate, in particular an additional wafer or a mask, the holder being arranged opposite the carrier element. Between the base body and the carrier element, a sealed-off cavity is provided to which a pressure, in particular a negative pressure, can be applied so as to prevent undesired movement of the carrier element as a result of the action of an external force. This achieves the advantage that undesired movement of the substrate, for example during a sudden change in pressure above the substrate, can be efficiently prevented, and the process result can thus be improved.

The substrate may be a wafer. The substrate may be disc-shaped, and may have a substantially round periphery having a diameter of 2, 3, 4, 5, 6, 8, 12 or 18 inches. The substrate may further be substantially planar, and may have a thickness of between 50 and 3000 µm. The substrate may have a straight edge (flat) and/or at least one groove (notch). The substrate may further be polygonal, in particular square or rectangular, in form.

The substrate may be formed from a semiconductor material, for example silicon (Si) or gallium arsenide (GaAs), a glass, for example quartz glass, a plastics material or a ceramic. The substrate may be formed from a monocrystalline, polycrystalline or amorphous material. Further, the substrate may in each case comprise a plurality of composited materials. The substrate may be coated with a coating, for example a polymer such as a photoresist or an adhesive, on at least one face. Further, the substrate may comprise a metal coating, for example a structured chromium layer.

The substrate may comprise structures, in particular regularly arranged structures, on at least one substrate surface. The structures may form elevations and/or cavities on the substrate surface. The structures may comprise electrical circuits, for example transistors, LEDs or photodetectors, electrical conducting tracks which connect these circuits, or optical components. The structures may further comprise MEMS or MOEMS structures. The substrate may further comprise residues or impurities, for example glue beads, on one or both substrate surfaces.

The base body and/or the carrier element may each be formed of plastics material or metal, in particular aluminium. The carrier element may be coupled to the base body. For example, the base body comprises a recess into which the carrier element may be inserted at least in part. The cavity may be formed by the part of the recess in the base body which is not received by the carrier element.

The movement of the carrier element in terms of distance from the base body may be perpendicular to the base body or along a transverse axis of the base body. As a result of the movement of the carrier element, a distance of the carrier element from the base body may be variable; in particular, a height of the carrier element above the base body may be variable.

The positioning device, in particular the carrier element and/or the base body, may form a chuck.

The support may comprise a recess in the carrier element or be formed as a recess in the carrier element. The periphery of the recess may substantially correspond to the periphery of the substrate, in such a way that the substrate can be inserted into the recess.

The further substrate may also be a wafer. The further substrate may further be a mask, in particular a photolithography mask, or a stamp, in particular a microimprint or nanoimprint stamp, for the substrate.

The substrate and/or the further substrate may be substantially the same size, in particular having a substantially equal periphery. The further substrate may be formed as a lid and/or cover for the substrate. The further substrate may be formed transparent to light.

By means of the positioning device, a distance of the substrate from the opposite further substrate can be adjusted. For example, the positioning device may bring together and/or bring into contact the substrate and the further substrate. Subsequently, a lithography process, a bonding process and/or an imprinting process may be carried out.

The base body, the carrier element and the holder can be arranged within the process chamber.

In an embodiment, the sealed-off cavity comprises a pressure terminal, via which the pressure in the cavity can be controlled. By means of the pressure terminal, the pressure in the cavity can be kept at and/or brought to a desired value during the process, meaning that the position of the carrier element can be controlled very efficiently in a very simple manner.

In an embodiment, an adjustment element, in particular a lifting element, is arranged between the base body and the carrier element so as to adjust the distance of the carrier element from the base body. This achieves the advantage that the substrate can efficiently be positioned at a fixed distance from the base body. The adjustment or lifting element may comprise a number of pins which are received at least in part in the base body. The pins may be extensible and retractable, so as to vary the distance of the carrier element from the base body. The lifting elements may comprise piezo elements.

The adjustment element may be electrically and/or pneumatically actuable to adjust the distance of the carrier element from the base body. The adjustment element may further be actuable by way of control commands.

In an embodiment, the positioning device comprises a restoring element, in particular a spring, which acts between the base body and the carrier element. This achieves the advantage that the carrier element can be restored to a particular initial position if for example the pressure is not being applied to the cavity. Further, the restoring element can additionally assist in the pneumatic fixing of the carrier element.

In an embodiment, a number of support elements, which set a minimum distance of the carrier element from the base body, are arranged between the base body and the carrier element. This achieves the advantage that by setting a minimum distance between the carrier element and the base body a minimum size of the cavity can also be set. Further, by means of the support elements, the position of the carrier element can be fixed if there is a negative pressure in the cavity.

In an embodiment, the positioning device comprises a guide for guiding the movement of the carrier element. The guide may be arranged between the base body and the carrier element. In a simple manner, the guide prevents undesired lateral displacement of the carrier element, such as might occur for example as a result of the resilience of seals which are present between the carrier element and the base body to delimit the cavity. The guide may be formed as a solid body guide.

In an embodiment, the carrier element comprises a fixing device, by means of which the substrate positioned on the support can be fixed, in particular mechanically, pneumatically and/or electrostatically. This ensures that the substrate is not displaced during the process, for example by the external forces acting during the process.

For this purpose, the support and/or the carrier element may comprise means for fixing the substrate, for example brackets and/or suction openings.

In an embodiment, a further pressure, in particular an overpressure, can be applied to the sealed-off cavity so as to move the carrier element towards the mounting in a targeted manner. This achieves the advantage that the distance between the substrates is adjustable pneumatically by apply pressure to the cavity. The overpressure can be set by way of a positive pressure difference from a pressure in a process chamber, a process cavity in the positioning device, and/or from an ambient pressure.

In an embodiment, the holder is formed to orientate a surface of the further substrate towards the substrate positioned on the support. This achieves the advantage that the further substrate can be arranged efficiently with respect to the substrate positioned on the support.

In an embodiment, there is, between the carrier element and the holder, a process cavity, the size of which is set at least in part by the distance between the carrier element and the holder.

The process cavity can be part of the process chamber or the process cavity forms the process chambers.

The process cavity may further comprise a pressure terminal.

In an embodiment, the positioning device comprises sealing means, in particular an inflatable sealing lip, for sealing off the process cavity. This achieves the advantage that the process cavity can be sealed off efficiently, for example so as to maintain an overpressure or negative pressure in the process cavity.

In an embodiment, an overpressure or a negative pressure can be applied to the process cavity and/or it can be evacuated, or the process cavity is provided with a gas terminal through which a gas can be introduced, in particular helium. This achieves the advantage that the substrates can be processed in a controlled environment, for example a vacuum. The external force effect can be set by way of a pressure difference between the cavity and the process cavity.

Evacuating the process cavity makes it possible to establish vacuum contact between the substrate and the further substrate. For this purpose, the cavity between the substrates is for example initially evacuated. Subsequently, the positioning device can move the substrate towards the further substrate and bring the two substrates into contact. Cavities on the surface of the substrate and/or of the further substrate can thus be evacuated before the substrates are contacted.

When the process cavity is evacuated, this can result in a negative pressure. This negative pressure may act on the carrier element or the substrate positioned thereon as an external force, and this may lift the carrier element or the substrate and press the substrates onto one another before evacuation is complete. To counter this external force, the cavity between the carrier element and the base body can now also be evacuated, resulting in a second force, which counters the external force and fixes the carrier element. After the process cavity between the substrates is completely evacuated, the adjustment element can move the carrier element towards the holder in a targeted manner so as to bring the two substrates together.

In an embodiment, the positioning device comprises a spacer, in particular a wedge or a wedge spacer, which is insertable between the base body and the holder so as to adjust and/or fix a distance between the base body and the holder. This achieves the advantage that a movement of the holder towards the base body due to an external force, for example due to the negative pressure in the process cavity, can be efficiently prevented.

In a second aspect, the invention relates to a method for bringing a substrate, in particular a wafer, together with a further substrate, in particular a further wafer or a mask, the method comprising the following method steps: fixing the substrate with respect to the further substrate; evacuating a sealed-off cavity below the substrate so as to prevent undesired movement of the substrate due to the action of an external force; and moving the substrate towards the further substrate in a controlled manner, the substrate and the further substrate being located in a process cavity, the size of which is set at least in part by the distance between the substrates, it being possible to apply an overpressure or negative pressure to the process cavity and/or to evacuate it, or it being possible to fill the process cavity with a gas, in particular helium. This achieves the advantage that undesired movement of the substrate, for example before the substrates are brought together in a targeted manner, can be efficiently prevented. Immediately before or after the pressure is applied to the cavity, process conditions which bring about the external force on the substrate can be adjusted. For example, a negative pressure is generated between the substrates. Furthermore, this achieves the advantage that the substrates can be processed in a controlled environment, for example a vacuum. The external action of force can be set by way of a pressure difference between the cavity and the process cavity.

Evacuating the process cavity makes it possible for example to establish vacuum contact between the substrate and the further substrate. For this purpose, in an additional method step the cavity between the substrates may initially be evacuated. Subsequently, the substrate may be moved towards the further substrate, and the two substrates may be brought into contact. Cavities on the surface of the substrate and/or of the further substrate can thus be evacuated before the wafer is contacted.

The substrate and/or the further substrate may each be a wafer, in particular a glass or semiconductor wafer. The further substrate may further be a mask, in particular a photolithography mask, or a stamp, in particular a nanoimprint or microimprint stamp.

The substrate and/or the further substrate may be substantially the same size, in particular having a substantially equal periphery. The further substrate may be formed as a lid and/or cover for the substrate. The further substrate may be formed transparent to light.

Fixing the substrate may comprise fixing to a carrier element, in particular to a support of the carrier element. The carrier element may comprise a fixing device for this purpose. The further substrate may in turn be fixed to a holder opposite the carrier element.

In an embodiment, the method further comprises connecting, in particular bonding, the substrates. This achieves the advantage that particularly efficient wafer bonding can be made possible. The cavity to which negative pressure is applied prevents the two substrates from being able to come into contact prematurely, for example. It can thus be ensures that optimum process conditions are present before the substrates are contacted.

In an embodiment, moving the carrier element towards the holder in a controlled manner comprises applying a further pressure, in particular an overpressure, to the cavity. This achieves the advantage that the substrates can be brought together efficiently by applying pressure to the cavity.

The positioning device in accordance with the first aspect of the invention may be formed to carry out the method in accordance with the second aspect of the invention.

BRIEF DESCRIPTION OF THE DRAWINGS

Further embodiments are explained in greater detail with reference to the accompanying drawings, in which:

FIG. 4a-g are schematic drawings of the positioning device of FIG. 2, which is being used for connecting two substrates.

DETAILED DESCRIPTION OF THE INVENTION

Figure 1:
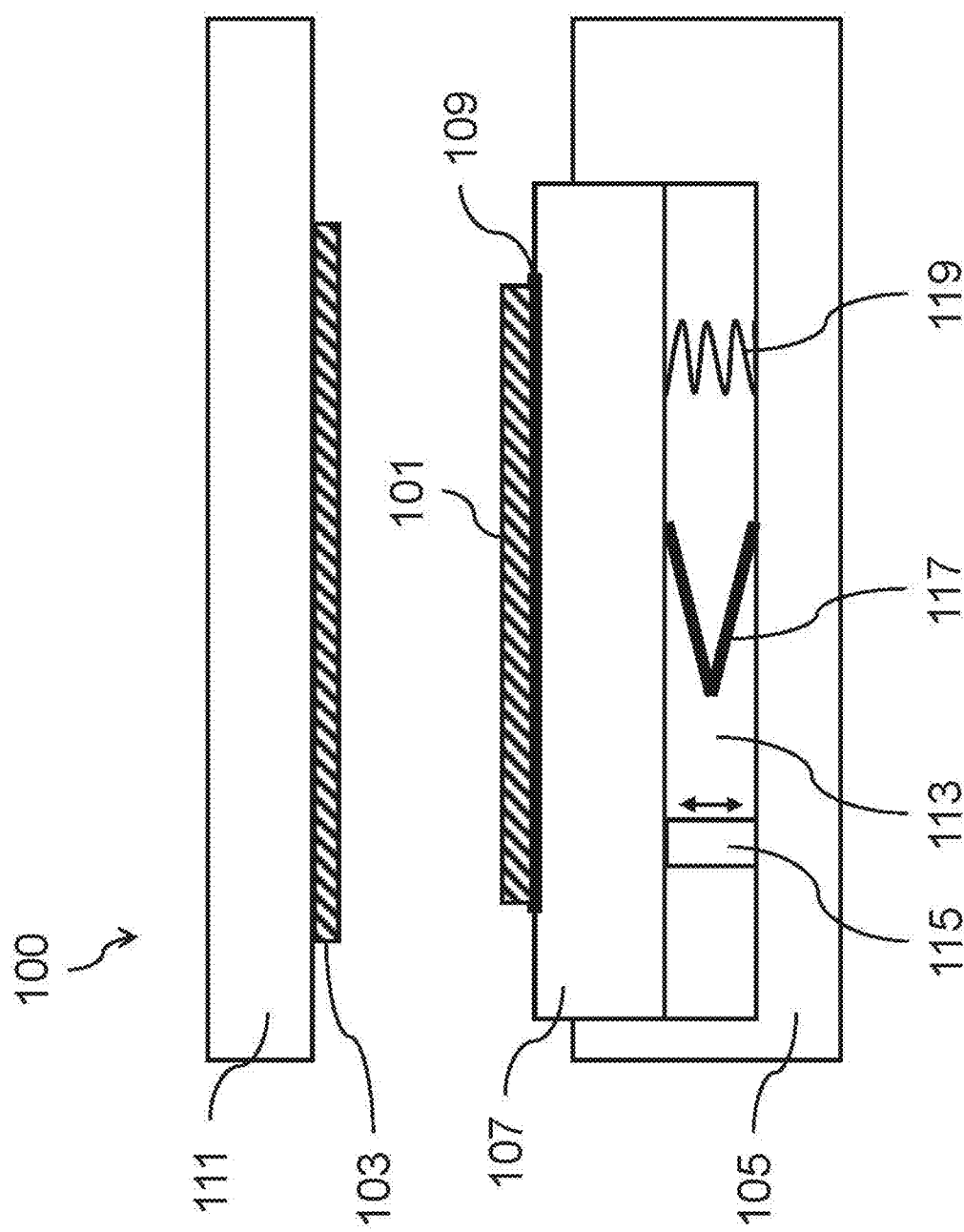
FIG. 1 is a schematic drawing of part of a positioning device for a substrate.

FIG. 1 is a schematic drawing of part of the positioning device 100 for positioning a substrate 101 in accordance with an embodiment.

The positioning device 100 comprises a base body 105 and a carrier element 107, which comprises a support 109 for supporting the substrate 101, the carrier element 107 being arranged above the base body 105 and being formed movable in terms of distance from the base body 105.

The positioning device 100 further comprises a holder 111 for a further substrate 103, the holder 111 being arranged opposite the carrier element 107.

In the positioning device 100, there is, between the base body 105 and the carrier element 107, a sealed-off cavity 113 to which a pressure, in particular a negative pressure, can be applied so as to prevent undesired movement of the carrier element 107 or the support substrate 101 towards the holder as a result of the action of an external force.

By means of the positioning device 100, the distance of the substrate 101 from the further substrate 103 fixed to the holder 111 can further be adjusted. For example, the positioning device 100 may bring together and/or bring into contact the substrate 101 and the further substrate 103. Subsequently, a lithography process, a bonding process and/or an imprint process may be carried out.

The substrate 101 and/or the further substrate 103 may each be a wafer. The further substrate 103 may further be a mask, in particular a photolithography mask, or a stamp, in particular a microimprint or nanoimprint stamp for the substrate 101.

The substrate 101 and/or the further substrate 103 may be substantially the same size, in particular have a substantially equal periphery. The further substrate 103 may be formed as a lid and/or cover for the substrate 101. The further substrate 103 may be formed transparent to light.

The substrate 101 and/or the further substrate 103 may each be disc-shaped. The substrate 101 and/or the further substrate 103 may each have a substantially round periphery having a diameter of 2, 3, 4, 5, 6, 8, 12 or 18 inches. The substrates 101, 103 may further be substantially planar, and may each have a thickness of between 50 and 3000 µm. The substrates 101, 103 may each have a straight edge (flat) and/or at least one groove (notch). The substrates 101, 103 may further be polygonal, in particular square or rectangular, in form The substrate 101 and/or the further substrate 103 may each be formed from a semiconductor material, for example silicon (Si) or gallium arsenide (GaAs), a glass, for example quartz glass, a plastics material or a ceramic. The substrate 101 and/or the further substrate 103 may each be formed from a monocrystalline, polycrystalline or amorphous material. Further, the substrates 101, 103 may each comprise a plurality of composited materials. At least one of the substrates 101, 103 may be coated with a coating, for example a polymer such as a photoresist or an adhesive, on at least one face. Further, at least one of the substrates 101, 103 may comprise a metal coating, for example a structured chromium layer.

The substrate 101 and/or the further substrate 103 may each comprise structures, in particular regularly arranged structures, on at least one substrate surface. The structures may form elevations and/or cavities on the substrate surface. The structures may comprise electrical circuits, for example transistors, LEDs or photodetectors, electrical conducting tracks which connect these circuits, or optical components. The structures may further comprise MEMS or MOEMS structures. The substrate 101 and/or the further substrate 103 may further comprise residues or impurities, for example glue beads, on one or both substrate surfaces. The structures or residues may be on a surface of the substrate 101 or of the further substrate 103 facing the other substrate in each case.

The base body 105 and/or the carrier element 107 may each be formed of plastics material or metal, in particular aluminium. The carrier element 107 may be coupled to the base body 105. For example, the base body 105 comprises a recess into which the carrier element 107 may be inserted at least in part. The cavity 113 may be formed by the part of the recess in the base body 105 which is not received by the carrier element 107.

The movement of the carrier element 107 in terms of distance from the base body 105 is substantially perpendicular to the base body. Additionally, a component oblique thereto may also be used. As a result of the movement of the carrier element 107 with respect to the base body 105, the distance of the carrier element 107 from the base body 105 is varied; in particular, a height of the carrier element 107 above the base body 105 may be varied.

The carrier element 107 and/or the base body 105 may form a chuck.

The support 109 may comprise a recess in the carrier element 107 or be formed as a recess in the carrier element 107. The periphery of the recess may substantially correspond to the periphery of the substrate 101, in such a way that the substrate 101 can be inserted into the recess.

The carrier element 107 may comprise a fixing device (not shown in FIG. 1), for fixing the supported substrate 101. This fixing is for example mechanical, pneumatic and/or electrostatic. For example, this fixing prevents the substrate from being released from the support by the external force. The support 109 and/or the carrier element 107 may comprise fixing means such as brackets and/or suction openings for this purpose. The fixing device may be a clamping device.

The holder 111 is formed to orientate a surface of the further substrate 103 towards the substrate 101 positioned on the carrier element 107. The substrate 103 is fixed in the holder 111 mechanically, pneumatically or electrostatically. The holder 111 is for example a vacuum holder, which presses in or sucks in and fixes the further substrate 103 by means of a negative pressure.

The position of the holder 111 may further be adjustable in a plane parallel to the carrier element 107 and the supported substrate 101 and/or perpendicular to the carrier element 107 and the supported substrate 101. For example, the holder 111 makes possible precise positional adjustment of the further substrate 103 parallel to the surface of the substrate 101 supported on the carrier element 107, so as to make orientation (alignment) of the substrates 101, 103 possible. For the same purpose, the carrier element 107 and/or the base body 105 may also be movable transverse to the supported substrate 101.

The holder 111 may be formed transparent to light, in particular in an ultraviolet wavelength range. In particular, the holder 111 may be formed from glass or a transparent plastics material. This makes it possible to shine light through the holder 111, for example so as to illuminate the substrate 101 through a mask fixed to the holder 111, or so as to cure a bonding adhesive between the substrates 101, 103.

It may be possible to apply a further pressure, in particular an overpressure, to the sealed-off cavity 113 so as to move the carrier element 107 towards the holder 111 in a targeted manner. In this way, the distance between the substrates 101, 103 can be reduced, or the substrates 101, 103 can be brought into contact in a targeted manner.

To regulate the pressure, the sealed-off cavity 113 may comprise a pressure valve (not shown in FIG. 1).

The example positioning device 100 in FIG. 1 further comprises an adjustment element 115, a guide 117 and a restoring element 119.

The adjustment element 115 is formed for precisely adjusting the distance of the carrier element 107 from the holder 111. The adjustment element 115 may be arranged between the base body 105 and the carrier element 107. The adjustment element 115 may further assist in pneumatic adjustment of the distance of the carrier element from the holder by applying pressure to the cavity 113.

The adjustment element 115 may comprise a lifting element, in particular a pneumatic lifting element. The adjustment or lifting element 115 may comprise a number of pins which are received at least in part in the base body. The pins may be extensible and retractable, so as to vary the distance of the carrier element 107 from the base body 105. The lifting elements may comprise a piezo element or a plurality of piezo elements.

The adjustment element 115 may be actuable by way of control commands to adjust the distance of the carrier element 107 from the base body 105.

The guide 117 is formed to guide the movement of the carrier element 107 so as to prevent undesired lateral displacements of the carrier element 107.

The restoring element 119 is in this case a spring which is arranged between the base body 105 and the carrier element 107. The restoring element 119 can additionally promote the pneumatic fixing of the carrier element 107.

In a further embodiment, the adjustment element 115 is formed by the cavity between the base body 105 and the carrier element 107 to which pressure is applied. Thus, by applying a pressure to the cavity 113, it is possible both to adjust the distance of the carrier element 107 from the base body 105 and to fix the position of the carrier element 107.

Figure 2:
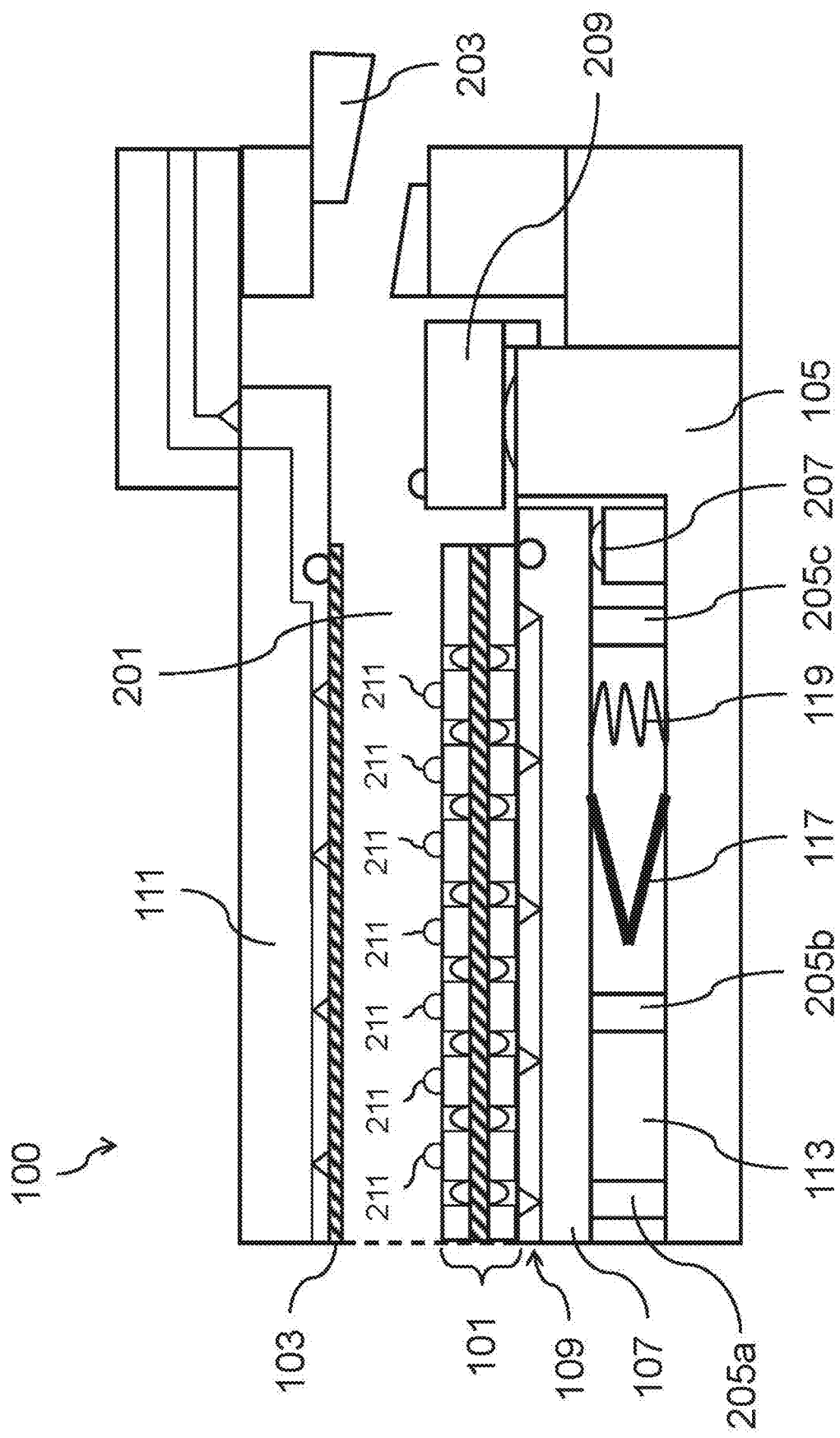
FIG. 2 is a schematic drawing of a positioning device in accordance with a further embodiment.

FIG. 2 is a schematic drawing of the positioning device 100 in accordance with a further embodiment, which generally corresponds to the first embodiment.

FIG. 2 shows the positioning device 100 with a process chamber, in particular for a lithography process or a bonding process, with a process cavity 201. The process cavity 201 is positioned between the carrier element 107 and the holder 111. The size of the process cavity 201 is substantially set by the distance between the carrier element 107 and the holder 111.

The process cavity 201 may form part of the process chambers, or the process cavity 201 can be the process chamber, in particular for a lithography or bonding process. An overpressure or negative pressure may be applied to the process cavity 201 and/or it may be evacuated. Further, the process cavity 201 may be filled with a gas, in particular helium. This makes it possible to process the substrates 101, 103 in a controlled process environment.

In an embodiment, evacuating the process cavity 201 makes it possible to establish vacuum contact between the substrate 101 and the further substrate 103. For this purpose, the process cavity 201 is initially evacuated. Subsequently, the positioning device 100 moves the substrate 101 towards the further substrate 103, so as to bring the two substrates 101, 103 into contact. Structures such as cavities on the surface of the substrate 101 and/or of the further substrate 103 can thus be efficiently evacuated before the substrates 101, 103 are contacted.

The application of pressure to the process cavity 201 between the carrier element 107 and the holder 111 can bring about or amplify the action of an external force on the carrier element. For example, when the process cavity 201 is evacuated this results in a negative pressure which brings about the action of an external force on the carrier element 107 and/or the supported substrate 101. This external force can cause the carrier element 107 or the substrate 101 to lift and the substrates 101, 103 to be pressed together before all structures on the respective substrate surfaces have been fully evacuated. Because a pressure is now also applied to the cavity 113 between the carrier element 107 and the base body 105, this force can be compensated and the substrates 101, 103 can be prevented from pressing together prematurely.

The action of an external force on the carrier element 107 or the substrate 101 may be the result of a pressure difference between the cavity 113 and the process cavity 201. By applying a suitable pressure to the cavity 113, this pressure difference and the resulting force can be minimised. After the process cavity 201 between the substrates is fully evacuated, the adjustment element 115 can move the carrier element 107 towards the holder 111 so as to bring the two substrates 101, 103 together. Vacuum contact can thus be established between the substrates 101, 103. Alternatively, an overpressure may be applied to the cavity 113 so as to move the carrier element 107 towards the holder 111 and bring the two substrates 101, 103 into contact.

FIG. 2 further shows an example of fixing the substrate 101 to the support 109 and the further substrate 103 to the holder 111 by means of vacuum suction. For this purpose, the support 109 and the holder 111 each comprise a plurality of suction openings which fix the substrate 101 or the further substrate 103 by means of a negative pressure.

In FIG. 2, the adjustment element 115 comprises a plurality of support elements 205*a-c*, so as to set a minimum distance of the carrier element 107 from the base body 105 and from the further substrate 103 in the holder 111. If there is a strong negative pressure in the cavity 113, the carrier element 107 can thus be prevented from pressing directly onto the base body 107.

In the example drawing of FIG. 2, the substrate 101 comprises structuring on the upper and the lower face. The structuring comprises regular structures, which are formed for example by cavities and/or electrical circuits. For example, the structures on the surface of the substrate 101 are LEDs and/or detectors which are embedded in respective cavities. The structuring of the substrate surface in FIG. 2 further comprises impurities in the form of glue beads 211 on the surface facing the further substrate 103. When the substrates 101, 103 are brought together, the further substrate 103 can be pressed onto the glue bead 211, resulting in an adhesive layer between the substrates 101, 103. The further substrate 103 may comprise transparent lids or covers for individual structures on the substrate 101, which are held in position above the structures after the adhesive layer cures.

The example positioning device 100 in FIG. 2 further comprises a wedge-shaped spacer 203 and sealing means 207, 209.

The spacer 203 is inserted between the base body 105 and the holder 111 so as to prevent undesired movement of the holder towards the base body.

When the process cavity 201 is evacuated, the negative pressure between the holder 111 and the carrier element 107 may bring about a further external force on the holder. This further external force may also cause the holder and the carrier element 107 or the supported substrate 101 to be pressed together. To prevent this, the spacer 203 is inserted between the holder and the base body before the process chamber 201 is evacuated.

The sealing means 207 is formed to seal off the cavity 113, in particular at different distances of the carrier element 107 from the base body 105. The sealing means 207 is preferably configured as a sealing ring and/or sealing lip, in particular an inflatable sealing lip.

The further sealing means 209 seals the process cavity 201 or the process chamber 201 at different distances of the holder 111 from the carrier element 107. For this purpose, the further sealing means 209 may also comprise a sealing ring and/or an inflatable sealing lip. The sealing lip of the sealing ring may be pressed against the holder 111 to seal off the process cavity 201.

Figure 3:
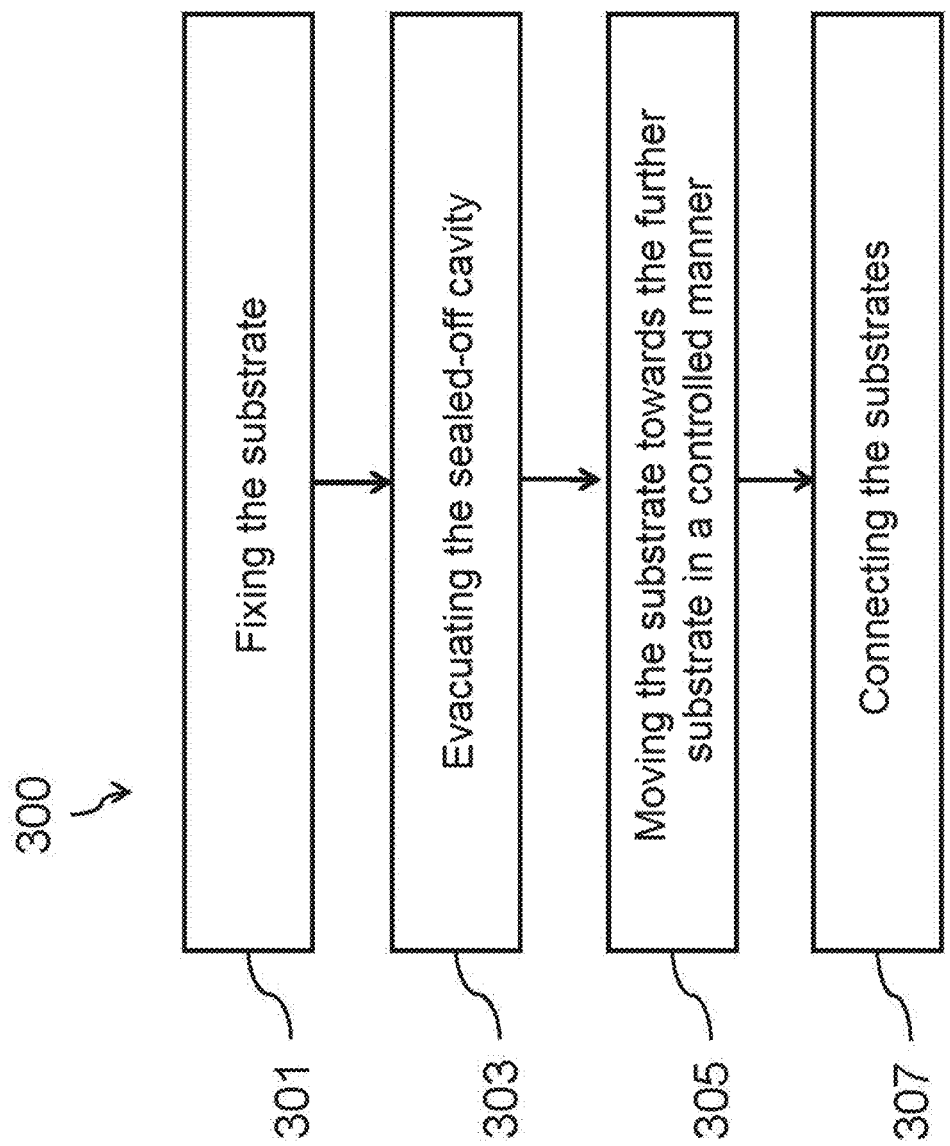
FIG. 3 is a flow chart of a method for bringing a substrate together with a further substrate.

FIG. 3 is a flow chart of a method 300 for bringing the substrate 101 together with the further substrate 103 in accordance with an embodiment. The substrates 101, 103 may each be a glass or semiconductor substrate. Further, the substrate 101 may be a wafer, and the further substrate 103 may be a mask or a stamp. The substrates 101, 103 may correspond to the substrates 101, 103 shown in FIG. 1 and/or FIG. 2.

The method 300 may be carried out using the positioning device of FIG. 1 and/or FIG. 2, and comprises fixing 301 the substrate 101 opposite the further substrate 103, evacuating 303 the sealed-off cavity 113 below the substrate 101 so as to prevent undesired movement of the substrate due to the action of an external force, and moving 305 the substrate 101 towards the further substrate 103 in a controlled manner.

The method 300 in FIG. 3 further comprises connecting 307, in particular bonding, the substrates 101, 103 which are brought together.

If the method 300 is carried out using a positioning device 100 which, as shown by way of example in FIG. 2, comprises a process chamber 201, this process chamber 201 can be evacuated before the carrier element 107 is moved towards the further substrate 103 in a controlled manner 305. Before, during or after this evacuation, a negative pressure may be applied to the cavity 113 between the carrier element 107 and the base body 105, so as to prevent premature movement of the carrier element 107 towards the further substrate 103 and ensure full evacuation of structures and cavities on the substrate surfaces.

FIG. 4*a-g* are schematic drawings of the positioning device 100 of FIG. 2 during a connection process for connecting the two substrates 101, 103 in accordance with an embodiment.

FIG. 4*a* shows the initial state of the connection process. The substrate 101 comprising the glue beads is positioned on the support 109 of the carrier element 107, and the further substrate 103 is fixed to the holder 111. The support 109 and the holder 111 fix the substrates 101, 103 by means of a negative pressure. The pressure difference by means of which the substrate 101 is sucked onto the support 109 is for example $P_{Wafer}=-0.95$ bar. A negative pressure is also applied to the cavity 113 between the carrier element 107 and the base body 105, resulting in a pressure difference of $P_{Chuck}=-0.95$ bar from the ambient pressure. The inflatable sealing lip 209 is retracted in FIG. 4a. Thus, the pressure in the process chamber 201 corresponds to the ambient pressure (pressure difference $P_{Chamber}=0$ bar).

FIG. 4b shows a subsequent extension of the inflatable sealing lip 209 to seal off the process chamber 201. Further, the holder 111 is lowered and fixed at a set distance from the base body 105 by means of the wedge 203.

Figure 4C:
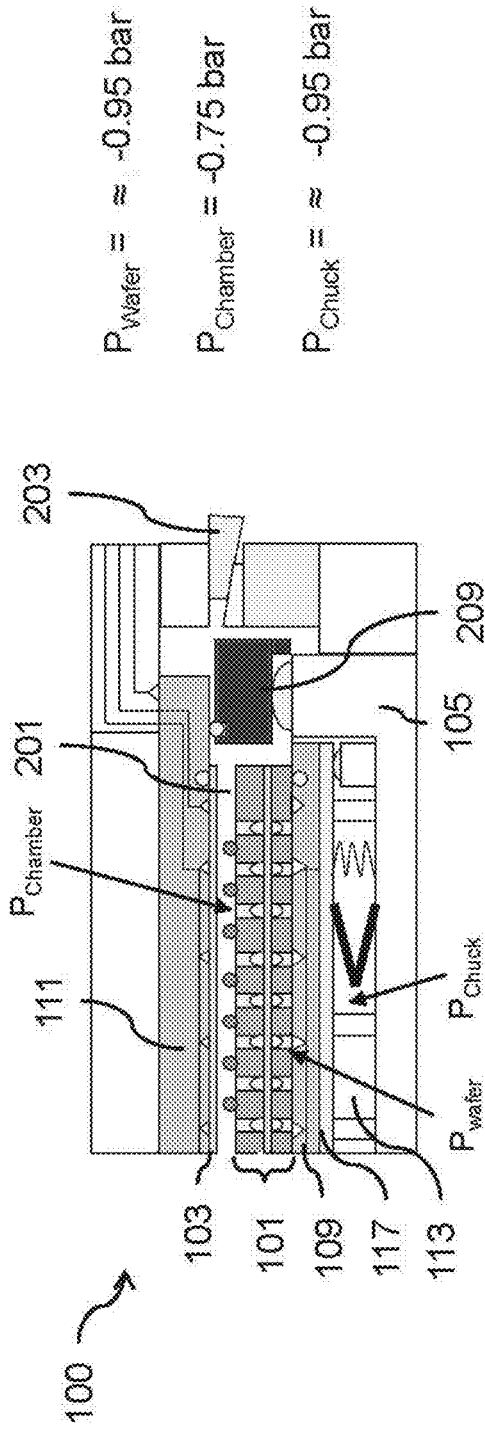

FIG. 4c shows an evacuation of the sealed-off process chamber 201. This results in for example a negative pressure difference from the ambient pressure of $P_{Chamber}=-0.75$ bar. Since a negative pressure is also applied to the pressure chamber 113, the evacuation of the process chamber 201 does not initially result in a movement of the carrier element 107 towards the holder 111.

Figure 4D:
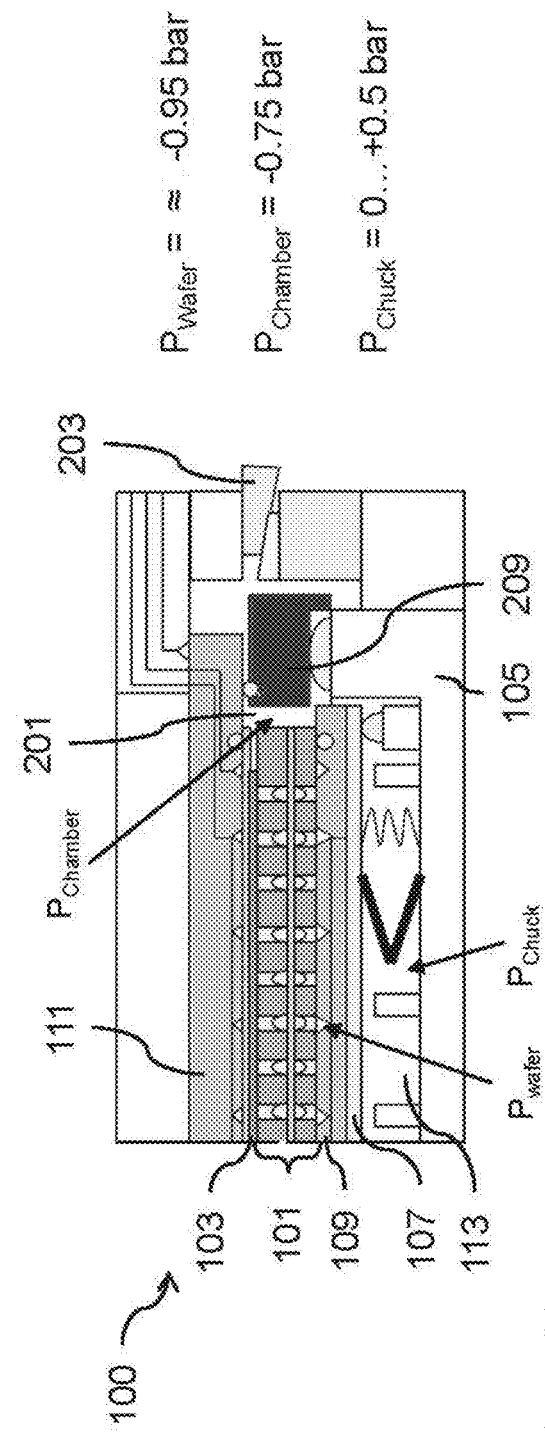

In the following process step, shown in FIG. 4d, an overpressure of for example $P_{Chuck}=+0.5$ bar is applied to the cavity 113. As a result, the wafer support movable in the z-direction presses the substrate 101 located on the carrier element 107 against the upper substrate 103. The glue beads can thus be compressed between the substrates 101, 103 and form a uniform adhesive layer. For a laterally adjustable carrier element 107 or a laterally adjustable support 109, adjustment is also possible at this time.

Figure 4E:
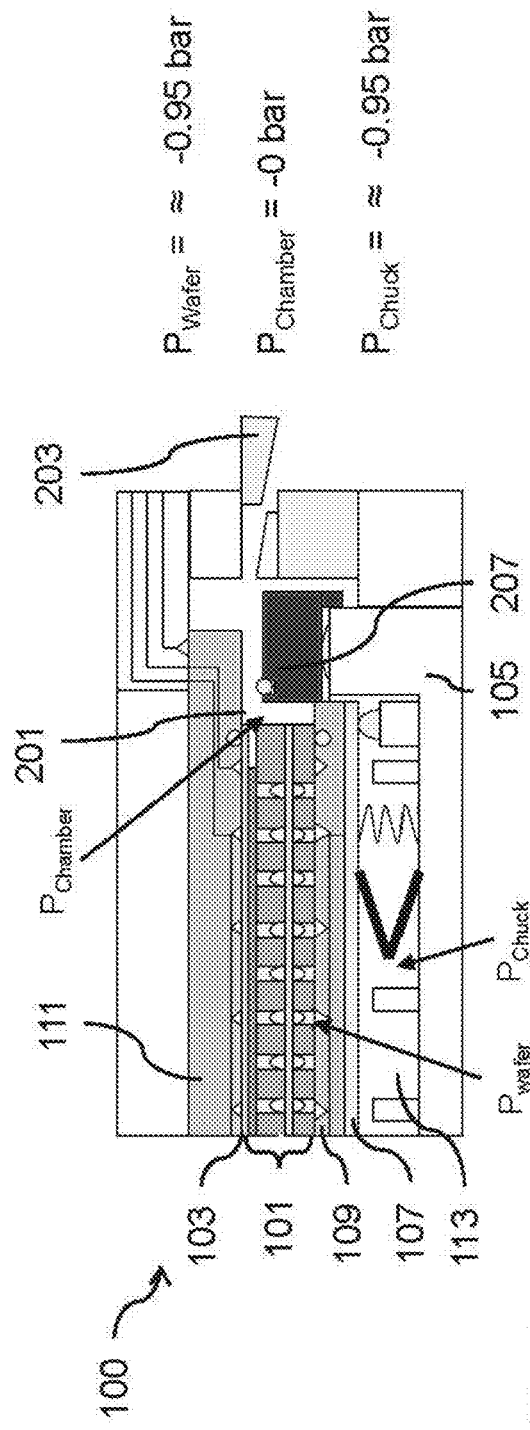

FIG. 4e shows subsequent retraction of the sealing lip 209 and removal of the wedge 203.

Figure 4F:
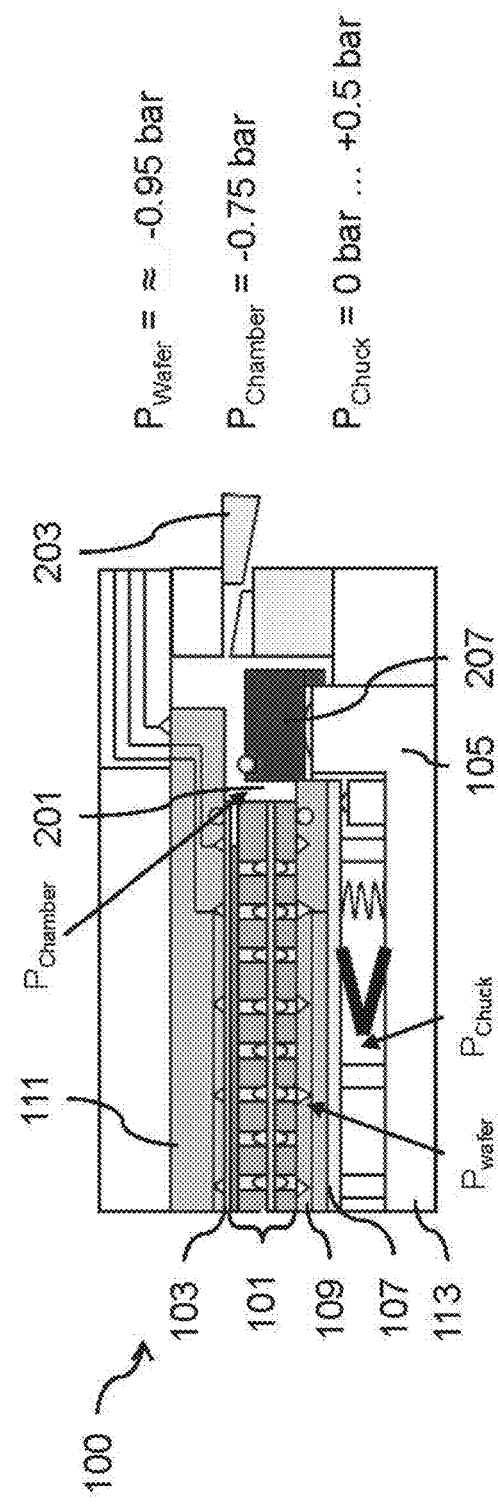

If fine adjustment was not possible in the previous step, the carrier element 107 can now be moved further towards the holder, sucked onto the chuck support and adjusted. This lowering of the carrier element is shown in FIG. 4f.

FIG. 4g shows subsequent illumination of the connected substrates with UV light 401 to cure the adhesive layer between the substrates 101, 103.

The positioning devices 100 shown in FIG. 1, 2 and FIG. 4a-g can be integrated into manufacturing systems for microstructure components, for example lithography systems such as mask aligners, laser writers, bonding systems such as wafer bonders, steppers, etching systems or cleaning systems.

The production systems may be formed for manufacturing process in which a vacuum is to be produced between substrates 101, 103 and/or vacuum contact is to be established between substrates 101, 103, for example for vacuum bonding.

LIST OF REFERENCE NUMERALS

100 Positioning device
101 Substrate
103 Further substrate
105 Base body
107 Carrier element
109 Support
111 Holder
113 Cavity
115 Adjustment element
117 Guide
119 Restoring element
201 Process cavity
203 Wedge
205a-c Support elements
207 Sealing means
209 Further sealing means
211 Adhesive bead
300 Method for bringing a substrate together with a further substrate
301 Fixing
303 Evacuating
305 Moving
307 Connecting
401 UV light

The invention claimed is:

1. A positioning device for positioning a substrate, comprising:
a process chamber;
a base body;
a carrier element which comprises a support for supporting the substrate, the carrier element being arranged above the base body and formed movable in terms of distance from the base body; and
a holder for an additional substrate, the holder being arranged opposite the carrier element;
wherein there is, between the base body and the carrier element, a sealed-off cavity to which a pressure can be applied so as to prevent undesired movement of the carrier element as a result of the action of an external force,
wherein the process chamber is arranged at least in part between the holder and the carrier element,
wherein an adjustment element is arranged between the base body and the carrier element so as to adjust the distance of the carrier element from the base body,
wherein the adjustment element comprises a number of extensible and retractable pins, so as to vary the distance of the carrier element from the base body.

2. The positioning device of claim 1, wherein the sealed-off cavity comprises a pressure terminal, via which the pressure in the cavity can be controlled.

3. The positioning device of claim 1, wherein the positioning device comprises a restoring element, which acts between the base body and the carrier element.

4. The positioning device of claim 1, wherein a number of support elements, which set a minimum distance of the carrier element from the base body, are arranged between the base body and the carrier element.

5. The positioning device of claim 1, wherein the positioning device comprises a guide for guiding the movement of the carrier element.

6. The positioning device of claim 1, wherein the carrier element comprises a fixing device, by means of which the substrate positioned on the support can be fixed.

7. The positioning device of claim 1, wherein there is, between the carrier element and the holder, a process cavity, the size of which is set at least in part by the distance between the carrier element and the holder.

8. The positioning device of claim 7, wherein the process cavity is part of the process chamber or defines the process chamber.

9. The positioning device of claim 7, wherein the positioning device comprises sealing means for sealing off the process cavity.

10. The positioning device of claim 7, wherein an overpressure or a negative pressure can be applied to the process cavity and/or it can be evacuated, or wherein the process cavity is provided with a gas terminal through which a gas can be introduced.

11. The positioning device of claim 1, wherein the positioning device comprises at least one spacer, which is insertable between the base body and the holder so as to adjust and/or fix a distance between the base body and the holder.

\* \* \* \* \*